US005780356A

United States Patent [19]
Kim

[11] Patent Number: 5,780,356
[45] Date of Patent: Jul. 14, 1998

[54] METHOD FOR FORMING METAL WIRE OF SEMICONDUCTOR DEVICE

[75] Inventor: Jeong Tae Kim, Ichon, Rep. of Korea

[73] Assignee: Hyundai Electronics Industires Co., Ltd., Ichon, Rep. of Korea

[21] Appl. No.: 764,218

[22] Filed: Dec. 13, 1996

[30] Foreign Application Priority Data

Dec. 15, 1995 [KR] Rep. of Korea ............... 1995-50454

[51] Int. Cl.$^6$ ........................................ H01L 21/283
[52] U.S. Cl. .................. 438/627; 438/643; 438/648; 438/656; 438/681
[58] Field of Search .................. 437/41 SM, 190, 437/192, 200; 257/751, 763, 764; 438/627, 643, 648, 653, 656, 350, 352, 680, 681

[56] References Cited

U.S. PATENT DOCUMENTS

| | | | |
|---|---|---|---|
| 5,162,262 | 11/1992 | Ajika et al. | 437/200 |
| 5,227,334 | 7/1993 | Sandhu | 437/190 |
| 5,420,072 | 5/1995 | Fiordalice et al. | 437/192 |
| 5,471,084 | 11/1995 | Suzuki et al. | |
| 5,478,780 | 12/1995 | Koerner et al. | |
| 5,573,978 | 11/1996 | Cho | 437/192 |
| 5,593,511 | 1/1997 | Foster et al. | 148/238 |

FOREIGN PATENT DOCUMENTS 62-283625   12/1987   Japan .

OTHER PUBLICATIONS

Raaijmakers, I., et al., "Contact Hole Fill with Low Temperature ....," Jun. 12-13, 1990, VMIC Conf., pp. 219-225, Jun. 1990.

*Primary Examiner*—T. N. Quach
*Attorney, Agent, or Firm*—Reid & Priest LLP

[57]    ABSTRACT

Operation of semiconductor devices suitable for high integration is achieved in a method for forming a metal wire, in which a plasma treating process is carried out to recruit a dense high-melting-point nitride film as a barrier layer. The method includes steps of providing a semiconductor substrate, forming an insulating layer having a contact hole over the semiconductor substrate, forming a high melting point metal film over exposed surfaces of the contact hole and the insulating layer, plasma treating the high melting point metal film to form a dense lower high melting point metal nitride film over the high melting point metal film, forming an upper high melting point metal nitride film over the dense lower high melting point metal nitride film in a chemical vapor deposition process, forming a tungsten layer on the upper high melting point metal nitride film within the contact hole so as to fill the contact hole, and forming a conductive metal film over the tungsten layer and the upper high melting point metal nitride film.

10 Claims, 2 Drawing Sheets

METHOD FOR FORMING METAL WIRE OF SEMICONDUCTOR DEVICE

BACKGROUND OF THE INVENTION

1. Field of the Invention

The present invention relates, in general, to a method for fabricating a semiconductor device and, more particularly, to form a metal wire of a semiconductor device.

2. Description of the Prior Art

In a semiconductor device, titanium (Ti) is generally used for the wetting film of a titanium nitride (TiN) layer which usually serves as a diffusing barrier or glue layer between a tungsten layer and an aluminum metal wire at a metal contact.

Typically, the formation of metal wire at a metal contact of a semiconductor device is performed by depositing a titanium layer and a titanium nitride layer through a sputtering process and then, an aluminum layer.

As the integration of a semiconductor device increases, the metal contact is reduced to sub-microns in size. In this case, the conventional aluminum deposition does not allow the contact to be adequately filled. Accordingly, this poor step coverage causes the significant problem of deteriorating the properties of the semiconductor device.

To solve this problem, techniques have been suggested by which the titanium layer is covered at a step coverage of about 80% or more. For example, the titanium nitride layer was first deposited in a chemical vapor deposition (hereinafter referred to as "CVD") process. Then, using a W-PLUG process, the contact was completely covered with tungsten which is, in turn, subjected to etch back. Finally, a metal wire was formed with aluminum. These procedures will be detailed in conjunction with some accompanying drawings.

Referring to FIG. 1, the conventional process for forming a metal wire of a semiconductor device is, in schematic form, described. As seen in this figure, an insulating layer 2 is formed on a silicon substrate 1 and then, opened at a predetermined area by etch, to form a contact hole 3 through which the silicon substrate is partially exposed. Next, a titanium layer 4 is deposited entirely on the surface of resulting structure including the contact hole 3. A CVD process is applied to deposit a titanium nitride 5 over the titanium film 4. Thereafter, the remainder of the contact hole space over the titanium nitride film 5 is filled with tungsten 6. Finally, an aluminum layer 7 is deposited over the resultant exposed surface of the titanium nitride 5 and the tungsten layer 6 to form a conductive wire.

Referring to FIG. 2, there is an enlarged view of "a" part of FIG. 1. Serving as a glue layer for the tungsten layer 6, the titanium nitride 5 is formed from tetrakisdimethylamino titanium $(Ti(N(CH_3)_2)_4$, hereinafter referring to as "TDMAT"). This liquid source is deposited at a high temperature in a thermal decomposition process.

However, because the titanium nitride is highly porous, it cannot prevent the penetration of $WF_6$, used as a source for the tungsten deposited, in the conventional process. The penetrated $WF_6$ reacts with the titanium layer and the silicon substrate to form volatile materials, such as $TiF_x$ and $SiF_x$, leading to deleterious effects on the properties of a semiconductor device.

SUMMARY OF THE INVENTION

Therefore, it is an object of the present invention to overcome the above problems encountered in prior arts and to provide a method for forming a metal wire of a semiconductor device, which can prevent damage to a high melting point metal layer and a silicon substrate.

It is another object of the present invention to provide a method for forming a metal wire of a semiconductor device, by which the semiconductor device is fabricated to be suitable for high integration.

In accordance with an aspect of the present invention, a method for forming a metal wire of a semiconductor device comprises the steps of: providing a semiconductor substrate; forming a high melting point metal film over the semiconductor substrate; plasma treating the high melting point metal layer to form a lower high melting point metal nitride film over the high melting point metal layer; forming an upper high melting point metal nitride over the lower high melting point metal nitride; and forming a wire film over the upper high melting point metal nitride film.

In accordance with another aspect of the present invention, a method for forming a metal wire of a semiconductor device comprises the steps of: providing a semiconductor substrate; forming an insulating layer having a contact hole over the semiconductor substrate; forming a high melting point metal film over the exposed surfaces of the contact hole and the insulating layer; plasma treating the high melting point metal film to form a lower high melting point metal nitride film over the high melting point metal film; forming an upper high melting point metal nitride film over the lower high melting point metal nitride film in a chemical vapor deposition process; forming a tungsten layer on the high melting point metal nitride film within the contact hole so as to fill the contact hole; and forming a wire film over the tungsten layer and the upper high melting point metal nitride film.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENT

Figure 1:
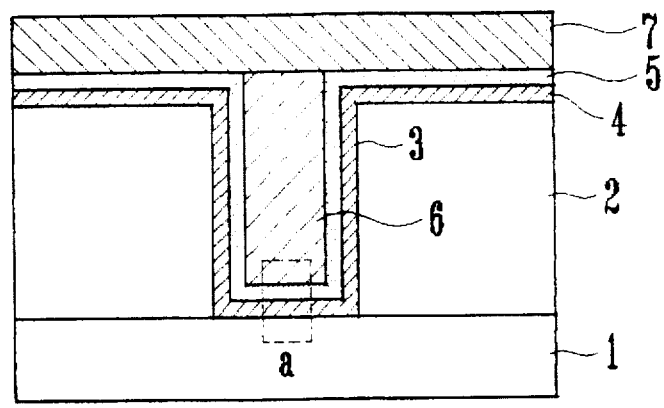
FIG. 1 is a cross sectional view illustrating a conventional method for forming a metal wire of a semiconductor device.
Figure 2:
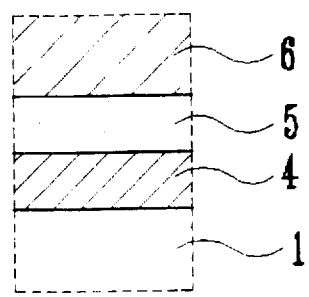
FIG. 2 is an enlarged cross sectional view of the "a" part of FIG. 1.

The application of the preferred embodiment of the present invention is best understood with reference to the accompanying drawings, wherein like reference numerals are used for like and corresponding parts, respectively.

Figure 3:
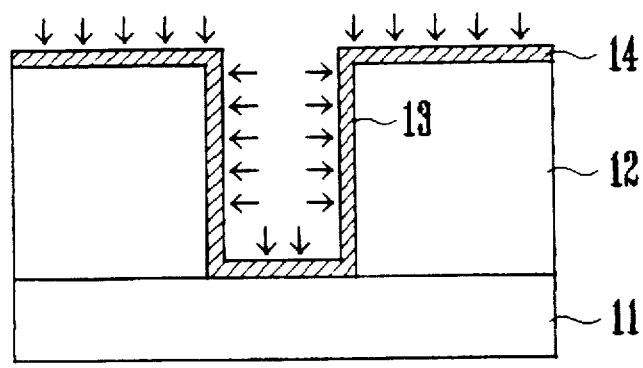
FIGS. 3 and 4 are cross sectional views illustrating a method for forming a metal wire of a semiconductor device, in accordance with the present invention.
Figure 4:
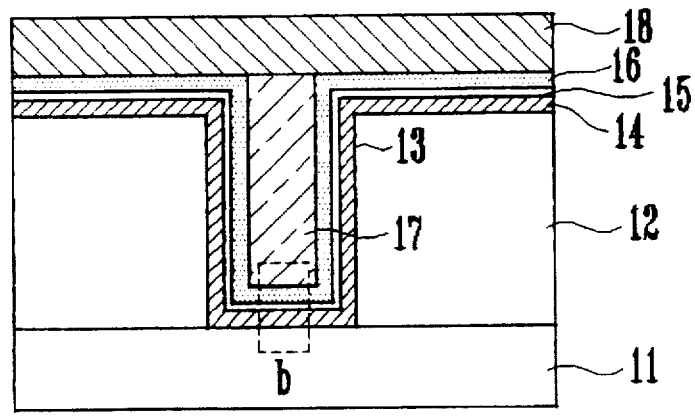

Referring to FIGS. 3 and 4, a method for forming a wire metal of a semiconductor device, according to the present invention is illustrated.

As shown in FIG. 3, an insulating film 12 is deposited over a silicon substrate 11 and selectively etched to form a contact hole 13 through which a predetermined area of the silicon substrate 11 is exposed.

Then, a titanium layer 14 is formed over the resultant exposed surface of the insulating layer 12 and the contact hole 13. Instead of this titanium layer 14, another layer may be formed from high melting temperature material.

Next, as shown in FIG. 4, the resulting structure is subjected to plasma treatment in nitrogen gas to form a dense first titanium nitride film 15 on the titanium film 14. In this plasma treatment, the nitrogen gas flows at a rate of 100–700 sccm under a pressure of 0.3–15 torr. It is preferred that the plasma treatment is carried out at a temperature of 100°–700° C. with a radio frequency ranging from 100–1000 W.

Thereafter, a second titanium nitride film 16 is formed over the dense first titanium nitride film 15 in a CVD process. As a source for the second titanium nitride film 16, TDMAT is employed. Alternatively, the second titanium nitride film 16 is formed from tetrakisdiethylamino titanium (TDEAT) or a source consisting of $TiCl_4$ and $NH_3$.

Subsequently, $WF_6$ gas is used to deposit tungsten on the second titanium nitride layer 16 until the contact hole 13 is filled after which the tungsten is subjected to etch back to form a tungsten layer 17 only within the contact hole 13.

Finally, an aluminum layer 18 is deposited on the resultant exposed surface of the tungsten layer 17 and the second titanium nitride film 16, to give a conductive wire.

Figure 5:
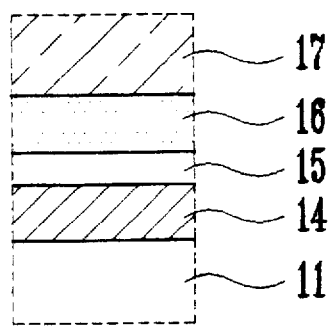
FIG. 5 is an enlarged cross sectional view of the "b" part of FIG. 4.

Referring to FIG. 5, the "b" part of FIG. 4 is enlarged. As seen in this figure, the presence of the dense titanium nitride film 15 between the tungsten layer 17 and the titanium layer 14 prevents the penetration of $WF_6$.

As described hereinbefore, the present invention is characterized in that the dense titanium nitride film is formed over the high melting point metal layer used as an under layer base, by a plasma treatment, thereby preventing the penetration of $WF_6$ into the titanium layer and the silicon substrate. Consequently, the semiconductor device is greatly improved in its operational characteristic and thus, suitable for high integration, in accordance with the method of the present invention.

The present invention has been described in an illustrative manner, and it is to be understood that the terminology used is intended to be in the nature of description rather than limitation. Many modifications and variations of the present invention are possible in light of the above teachings. Therefore, it is to be understood that within the scope of the appended claims, the invention may be practiced in ways other than those specifically described.

What is claimed is:

1. A method for forming a metal wire of a semiconductor device, comprising:

providing a semiconductor substrate;

forming an insulating layer having a contact hole over the semiconductor substrate;

forming a high melting point metal film over exposed surfaces of the contact hole and the insulating layer;

plasma treating the high melting point metal film to form a dense lower high melting point metal nitride film over the high melting point metal film;

forming an upper high melting point metal nitride film over the dense lower high melting point metal nitride film in a chemical vapor deposition process;

forming a tungsten layer on the upper high melting point metal nitride film within the contact hole so as to fill the contact hole; and forming a conductive metal film over the tungsten layer and the upper high melting point metal nitride film.

2. A method in accordance with claim 1, wherein the high melting point metal film includes a titanium film.

3. A method in accordance with claim 1, wherein both the dense lower high melting point metal nitride layer and the upper high melting point metal nitride layer are formed of titanium nitride.

4. A method in accordance with claim 1, wherein the plasma treating step is carried out in a nitrogen gas atmosphere.

5. A method in accordance with claim 4, wherein the plasma treating step is carried out at a nitrogen gas flow rate of 100–700 sccm.

6. A method in accordance with claim 1, wherein the plasma treating step is carried out:

at a temperature of 100°–700° C.

under a pressure of 0.3–15 torr with a radio frequency ranging from 100–1000 W.

7. A method in accordance with claim 1, wherein the upper high melting point metal nitride film is formed from a liquid tetrakisdimethylamino titanium source.

8. A method in accordance with claim 1, wherein the upper high melting point metal nitride film is formed from a liquid tetrakisdiethylamino titanium source.

9. A method in accordance with claim 1, wherein the upper high melting point metal nitride film is formed from a source including $TiCl_4$ and $NH_3$.

10. A method in accordance with claim 1, wherein the conductive metal film includes an aluminum film.

\* \* \* \* \*